(12) United States Patent
Lin et al.

(10) Patent No.: US 7,420,361 B2
(45) Date of Patent: Sep. 2, 2008

(54) METHOD FOR IMPROVING STABILITY AND LOCK TIME FOR SYNCHRONOUS CIRCUITS

(75) Inventors: Feng Lin, Boise, ID (US); J. Brian Johnson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/519,556

(22) Filed: Sep. 12, 2006

(65) Prior Publication Data

US 2007/0007941 A1    Jan. 11, 2007

Related U.S. Application Data

(60) Division of application No. 11/028,090, filed on Jan. 3, 2005, now Pat. No. 7,268,531, which is a continuation of application No. 10/425,069, filed on Apr. 28, 2003, now Pat. No. 6,839,301.

(51) Int. Cl.
    *G01R 13/02*    (2006.01)
(52) U.S. Cl. .................. 324/76.55; 324/76.54
(58) Field of Classification Search ............. 324/76.55, 324/76.54
    See application file for complete search history.

(56) References Cited

U.S. PATENT DOCUMENTS

| | | |
|---|---|---|
| 5,118,975 A | 6/1992 | Hills et al. |
| 5,703,489 A | 12/1997 | Kuroe |
| 6,300,807 B1 | 10/2001 | Miyazaki et al. |
| 6,373,913 B1 | 4/2002 | Lee |
| 6,381,194 B2 | 4/2002 | Li |
| 6,404,250 B1 | 6/2002 | Volrath et al. |
| 6,417,715 B2 * | 7/2002 | Hamamoto et al. ......... 327/291 |
| 6,437,613 B2 | 8/2002 | Shim et al. |
| 6,445,231 B1 | 9/2002 | Baker et al. |
| 6,446,180 B2 | 9/2002 | Li et al. |
| 6,476,652 B1 | 11/2002 | Lee et al. |
| 6,798,259 B2 * | 9/2004 | Lin ............................ 327/153 |
| 6,839,301 B2 | 1/2005 | Lin et al. |
| 7,064,592 B2 | 6/2006 | Jiang |
| 7,078,950 B2 | 7/2006 | Johnson |
| 7,095,261 B2 * | 8/2006 | Drexler et al. .............. 327/158 |
| 2002/0001240 A1 | 1/2002 | Ryu et al. |
| 2002/0097074 A1 | 7/2002 | Kim et al. |
| 2003/0169084 A1 * | 9/2003 | Gomm et al. ................ 327/158 |

* cited by examiner

*Primary Examiner*—Vincent Q Nguyen
(74) *Attorney, Agent, or Firm*—TraskBritt

(57) ABSTRACT

Delay-locked loops, signal locking methods and devices and systems incorporating delay-locked loops are described. A delay-locked loop includes a forward delay path, a feedback delay path, a phase detector and a timer circuit. The forward delay path alternatively couples to an external clock signal and to an internal test signal. The phase detector adjusts a delay line based upon the phase differences of a feedback signal and the external clock signal. The timer circuit switches the internal test signal into the forward delay path and measures the time of traversal of the internal test signal around the forward delay path and the feedback delay path and generates a time constant for configuring the phase detector's update period. The phase detector is thereafter able to stabilize at an improved rate.

10 Claims, 6 Drawing Sheets

METHOD FOR IMPROVING STABILITY AND LOCK TIME FOR SYNCHRONOUS CIRCUITS

CROSS-REFERENCE TO RELATED APPLICATIONS

This application is a divisional of application Ser. No. 11/028,090, filed Jan. 3, 2005, now U.S. Pat. No. 7,268,531, issued Sep. 11, 2007, which is a continuation of application Ser. No. 10/425,069, filed Apr. 28, 2003, now U.S. Pat. No. 6,839,301, issued Jan. 4, 2005.

BACKGROUND OF THE INVENTION

1. Field of the Invention

The present invention relates generally to memory devices and, more particularly, to memory devices adapted to receive input data and provide output data synchronized with a common external clock signal.

2. State of the Art

Integrated circuits, including memory and processors, which operate in synchronization with an external clock signal, typically generate an internal clock signal for gating the rippling nature of logic and for staging synchronous steps. Because of the inherent latencies associated with successive levels of propagation, the internal clock signal may be delayed when compared with the external clock signal. Such a delay may cause deterioration in the performance of the device during high-frequency operation. For example, during operation at high frequencies, the access time (i.e., the time required for outputting data after receipt of an external clock signal) may become longer than the time required for generating an internal clock signal from the received external clock signal.

Approaches have been explored for reducing the deterioration of the performance of a memory device at higher frequencies, one of which approach includes synchronizing the internal clock signal with the external clock signal. One synchronization implementation includes a delay locked loop (DLL) which is used as an internal clock signal generator. DLLs use an adjustable delay line comprised of a series of connectable delay elements. Digital information is used to either include or exclude a certain number of delay elements within a delay line. In a conventional DLL, a clock input buffer accepts a clock input signal and transmits the signal to one or more delay lines of delay elements. The delay of the delay path is increased from a minimum setting until the edge of the delayed reference clock is eventually time-shifted just past the next corresponding edge of the reference clock. As an element of a conventional DLL, a digital phase detector controls the delay line propagation delay so that the delayed clock remains synchronized with the external or reference clock.

Conventional DLLs suffer from numerous drawbacks. Loop stability and lock time are very important parameters for DLLs. In order to acquire a quick lock, the phase detector has to update as soon as possible. On the other hand, noise and long loop intrinsic delay require filtering to slow down the update rate due to desirable loop stability. Traditionally, the DLLs preferably operate within a wide frequency range and the loop time delay is dictated by the highest frequency. In short, the loop time delay is translated to be the number of clock cycles the phase detector waits until the next comparison. Under process, voltage, and temperature variations, the response time could be two cycles for low-speed operation and ten or more cycles for high-speed operation.

A need, therefore, exists to improve the performance of DLLs and overcome, or at least reduce, one or more of the problems set forth above.

BRIEF SUMMARY OF THE INVENTION

The present invention is directed at a circuit and method to implement a delay-locked loop for adjusting the phase of an internal clock signal on an integrated circuit to align with the phase of an external clock signal. In one embodiment, a delay-locked loop includes a forward delay path, a feedback delay path, a phase detector and a timer circuit. The forward delay path includes a clock input path and a delay line. The clock input path alternatively couples to the external clock signal and to an internal test signal. The delay line introduces adjustable delay into the internal clock signal for aligning the phase. The feedback delay path includes one or more delay models and generates a feedback signal to the phase detector. The phase detector adjusts the delay line based upon the phase differences of the feedback signal and the external clock signal. The timer circuit switches the test signal into the forward delay path and measures the time of traversal of the test signal around the forward delay path and the feedback delay path and generates a time constant for configuring the phase detector's update period. The phase detector is thereafter able to stabilize at an improved rate.

In another embodiment, the delay-locked loop is incorporated into a memory device including a memory array. The memory array latches retrieved data external to the memory device based upon an internal clock signal that undergoes phase adjustment according to the delay-locked loop. A further embodiment integrates the memory device into an electronic system.

Yet another embodiment includes a method for locking an internal clock signal with an external clock signal. An external signal is input into a forward loop path while initialization of a phase detector occurs. A test signal is switched into the forward loop path and timed during traversal of the forward and feedback loop paths. Based upon the traversal time of the test signal, the phase detector is configured to update the delay line at intervals that improve the lock time and improve stability of the phase detector.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

This disclosure describes prediction of an intrinsic DLL loop delay before starting and maintaining the synchronization. Generally, the DLL loop delay after lock is an integer number, n, of clock cycles. Generally, the DLL loop delay may include delay lines (e.g., fine, coarse, spare, etc.), clock distribution networks, clock drivers and buffers, and input/output (I/O) delays.

Figure 1:
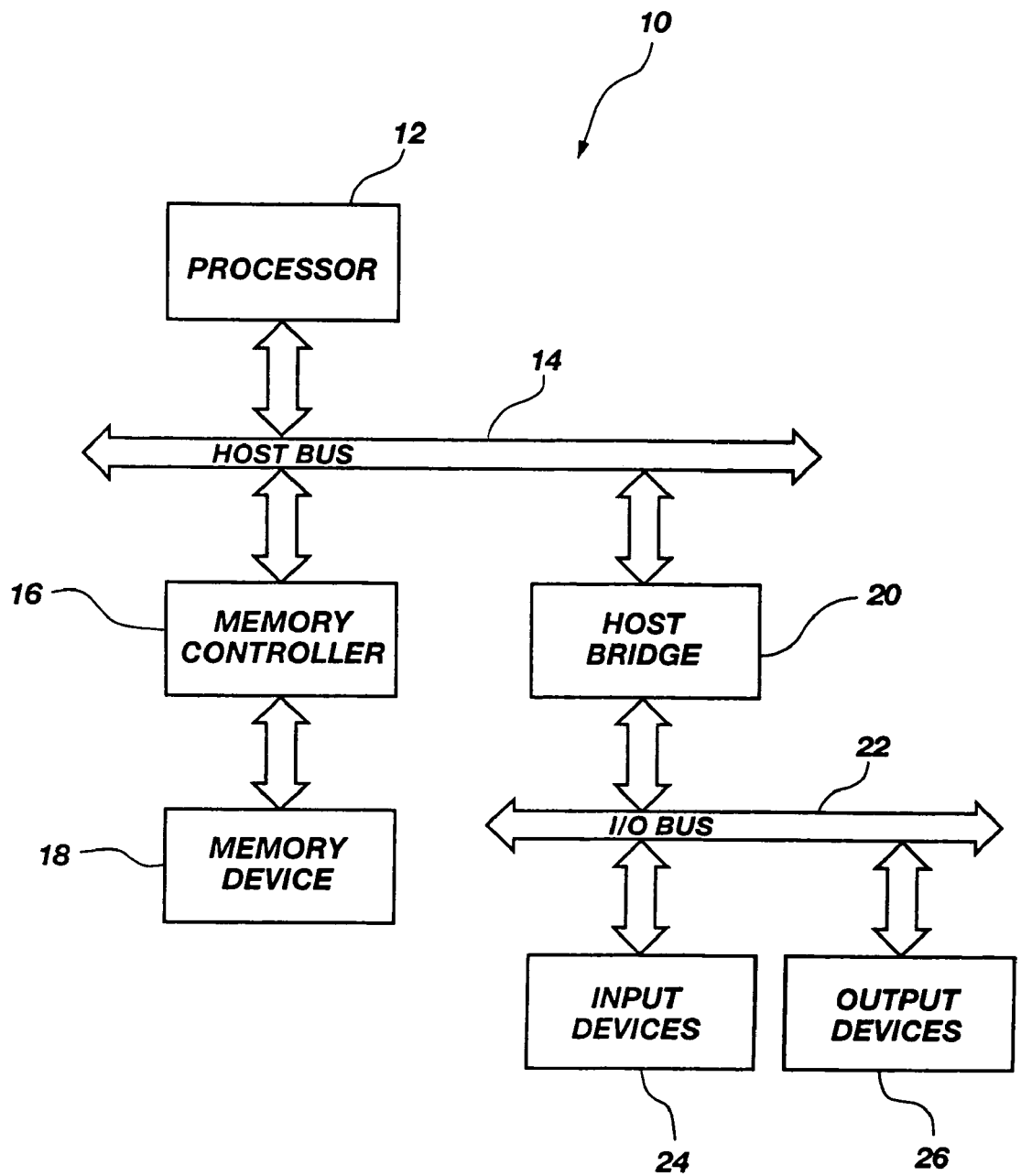
FIG. 1 is a system diagram of an electronic system, in accordance with an embodiment of the present invention.

In synchronous dynamic random access memory, the data out latch strobe or clock should be locked or maintain a fixed relationship to the external clock for high-speed performance. The clock-access and output-hold times are determined by the delay time of the internal circuits. Referring to FIG. 1, a simplified block diagram of an exemplary electronic system 10 (e.g., a computer system) is provided. The electronic system 10 includes a processor 12 coupled to a host bus 14. A memory controller 16 is coupled to both the host bus 14 and a memory device 18. A host bridge 20 couples the host bus 14 to an I/O bus 22 (e.g., a Peripheral Component Interconnect (PCI) bus). One or more input devices 24 couple to the I/O bus 22. Similarly, one or more output devices 26 couple to the I/O bus 22.

The processor 12 communicates with the memory device 18 through the memory controller 16. The memory controller 16 provides memory addresses and logic signals to the memory device 18 to characterize the desired memory transactions. In the illustrated embodiment, the memory device 18 is a synchronous memory device such as a Synchronous Dynamic Random Access Memory (SDRAM). Although the present invention is described in reference to an SDRAM, its application is not so limited. In light of the disclosure herein, the present invention may be adapted for use with other types of memory devices (not shown).

Figure 2:
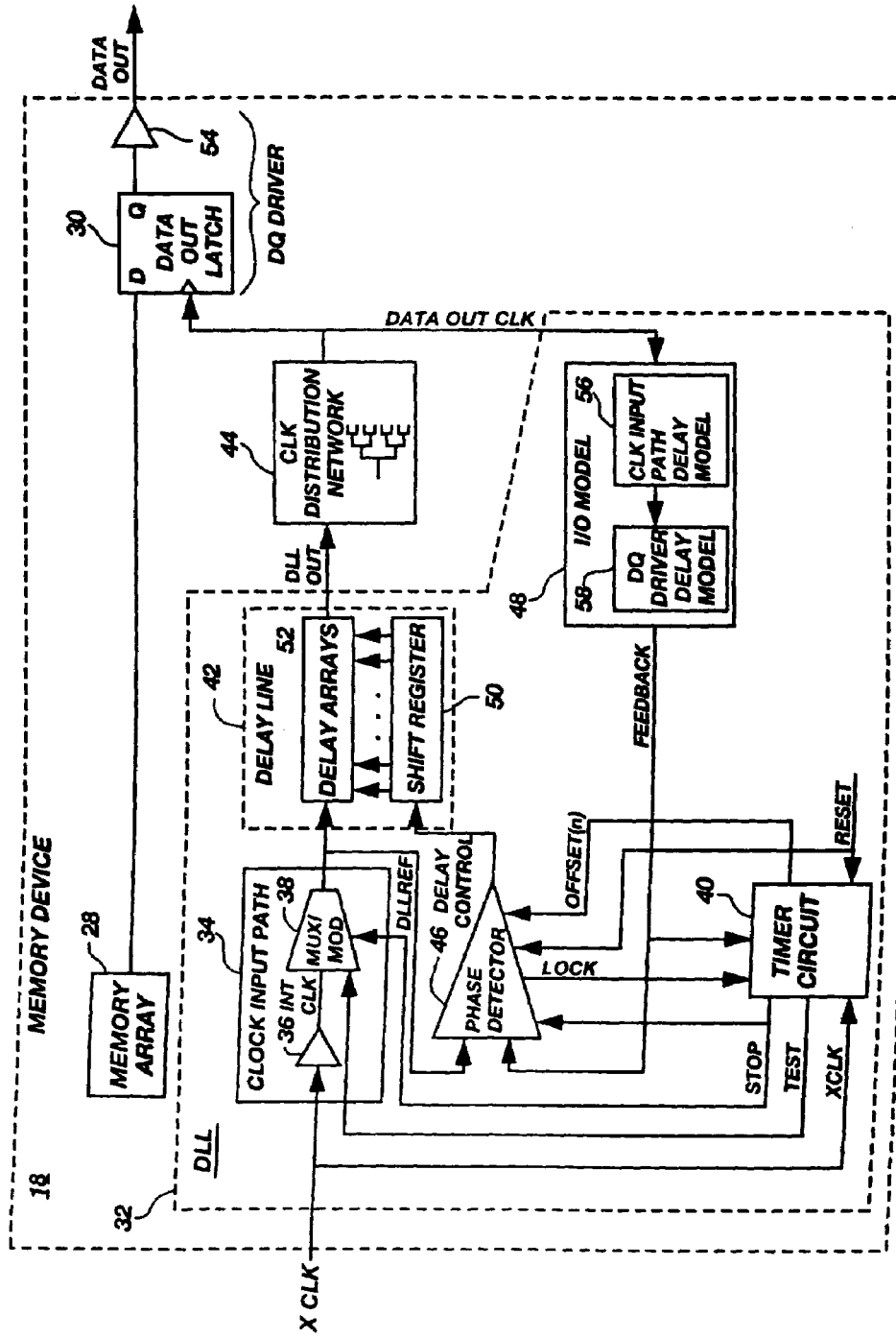
FIG. 2 is a block diagram of a memory device including a DLL capable of synchronization with an external input clock signal, in accordance with an embodiment of the present invention.

FIG. 2 illustrates a simplified block diagram of a memory device 18, in accordance with an exemplary embodiment of the present invention. Referring to FIG. 2, memory device 18 includes a memory core or memory array 28 for storing addressable data therein. Memory array 28 may further include pipelines or buffers for staging the delivery of data to a data output latch 30. Pipelining elements are representative of the characteristic delay of the device which is consistent with synchronous memory technologies. Staging or pipelining of data in synchronous memories is understood by those of ordinary skill in the art and is, therefore, not further described herein.

The memory device 18 further includes a Delay-Locked Loop (DLL) 32 implemented to predict the loop delay of a clock signal within memory device 18 and for providing the clock signal to the data output latch 30. DLL 32 includes a clock input path 34 for receiving an external clock signal XCLK. The external clock signal XCLK may originate from a memory controller 16 (FIG. 1) or may be generated independently by a clock generator (not shown) of electronic system 10 (FIG. 1). The external clock signal XCLK couples to an input of a clock buffer 36. The internal clock signal INTCLK is coupled to a clock stopping multiplexer 38 which multiplexes either the internal clock signal INTCLK or the test pattern signal or modulated-derivative of the clock signal TEST utilized during the calculation of the intrinsic delay path which is further described below. The clock stopping multiplexer 38 alternates the output based upon a control signal STOP received from a timer circuit 40, further described below.

The DLL 32 further includes a delay line 42 for receiving a signal DLLREF from the clock input path 34 and for generating a delay line output signal DLLOUT. The delay line 42 is configured to make adjustments to the loop delay by inserting or bypassing propagation delay elements within delay line 42. Those of ordinary skill in the art appreciate that delay line 42 inserts the desired delay into the clocking loop of the memory device such that the internal clock, as delayed by delay line 42, results in a synchronous output of data with the external clock signal XCLK.

Delay line 42 operates in conjunction with a phase detector 46 which generates an output based upon the difference of the input signals. When the difference between the input signals at phase detector 46 varies, phase detector 46 provides adjustments to delay line 42 in an attempt to arrive at a zero-phase differential between the input signals presented at the inputs of phase detector 46. Delay line 42 is exemplarily implemented as a digital DLL which includes a shift register 50 which, in the exemplary embodiment, is implemented such that the location of a bit within the shift register indicates the location for the coupling of the reference signal DLLREF, resulting in a determination of the amount of delay inserted by delay line 42. Delay line 42 further includes one or more delay arrays 52 which correspond to the implementation of one or more delay lines or paths within delay line 42. Delay line 42 may be implemented as a Synchronous Mirror Delay (SMD)-type or, alternatively, may be implemented as multiple independent delay lines within delay line 42. Additional implementations of alternative delay lines are also contemplated within the scope of the present invention. For example, in addition to independent multiple delay lines and SMD-type delays, other more traditional implementations including NAND delays and analog delay elements are also contemplated.

The delay line 42, in an exemplary embodiment, is comprised of one or more delay lines, one of which may be used during an initialization mode and is configured as an SMD-type delay. Such a configuration utilizes two delay lines and attempts to arrive at a fast initial lock. To do so, the SMD configuration measures the difference in phase to save time during the initialization.

Memory device 18 further includes a clock distribution network 44 coupled to DLL 32 by way of a DLL output signal DLLOUT. Clock distribution network 44 facilitates a uniform distribution or fanout to each of the outputs located within a specific memory device. One such specific output from clock distribution network 44 is illustrated as DATAOUTCLK, which provides a latching or strobing clock signal to a data output latch 30. Data output latch 30 couples to memory array 28 and generates an output signal that further couples to a DQ driver 54 while ultimately generating an output signal of memory device 18, illustrated as DATA OUT.

Memory device 18 further includes an I/O model 48 which couples the clock distribution network 44 with the phase detector 46 of DLL 32. I/O model 48 may be placed in the feedback loop path to provide an approximation of actual delays that occur in the input clock path and output data path between the external clock signal XCLK and the data output latch clocking signal DATAOUT CLK. By way of example and not limitation, I/O model 48 includes delay models for clock input path 34 illustrated as clock input path delay model 56 and a delay model characterizing the driver delay associated with data output latch 30 and DQ driver 54, illustrated as DQ driver delay model 58. While other actual delay representations may also be included within I/O model 48, delay models 56 and 58 are representative of those paths which contribute more significantly to the actual input clock path and output data path delay. I/O model 48 generates an output signal FEEDBACK which couples to an input of the phase detector 46.

While the phase detector 46 has generally been described with regard to its relationship to other elements of DLL 32, the phase detector 46 of the present invention includes internal functionality responsive to control signals and further generates output signals which identify a specific operational status of the phase detector 46. For example, phase detector 46, in addition to generating a phase differential output signal DELAY CONTROL, also generates an output signal LOCK identifying a phase-locked state wherein the inputs provided to phase detector 46, namely DLLREF and FEEDBACK, are in phase. Furthermore, control signals provided to phase detector 46 include a signal STOP causing the phase detector 46 to suspend any further adaptation of its phase differential output signal DELAY CONTROL in response to any phase differential of the input signals to the phase detector 46. Additionally, phase detector 46 receives an OFFSET signal identifying a quantity of entire clock cycles of delay through the forward loop path of the external clock XCLK within memory device 18. A RESET signal also couples with phase detector 46 causing the phase detector 46 to suspend any further processing.

The DLL 32 of the present invention further includes a timer circuit 40 coupled to both the clock input path 34 and the phase detector 46. While the specific operation of timer circuit 40 will be described with reference to the functional flowchart of FIG. 3, timer circuit 40 generally functions as a control circuit for inserting a test signal into the forward loop path and timing the propagation of the test signal through both the forward loop path and the feedback loop path of the DLL 32. By timing an actual inserted test signal, timer circuit 40 may determine an actual quantity of clock cycles required for propagating the external clock signal through the memory device and thereby provide an accurate reading to the phase detector 46 for optimization of sampling rates including the update rate associated with the generation of a phase differential signal DELAY CONTROL to delay line 42, thus improving the stability and overall performance of the DLL 32 within memory device 18.

Figure 3:
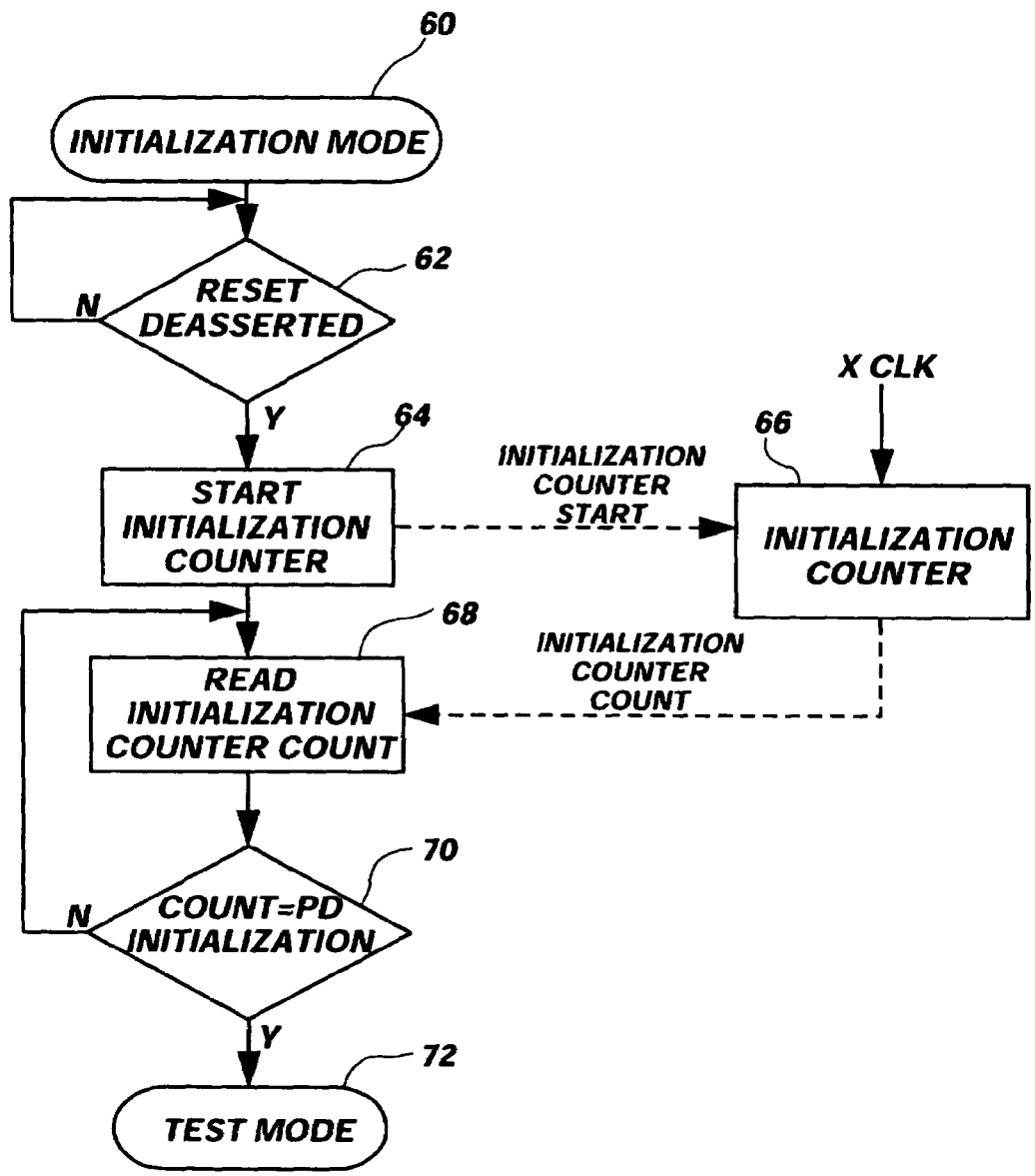
FIG. 3 is a flowchart illustrating an initialization of the DLL prior to identifying the DLL loop delay, in accordance with an embodiment of the present invention.
Figure 4A:
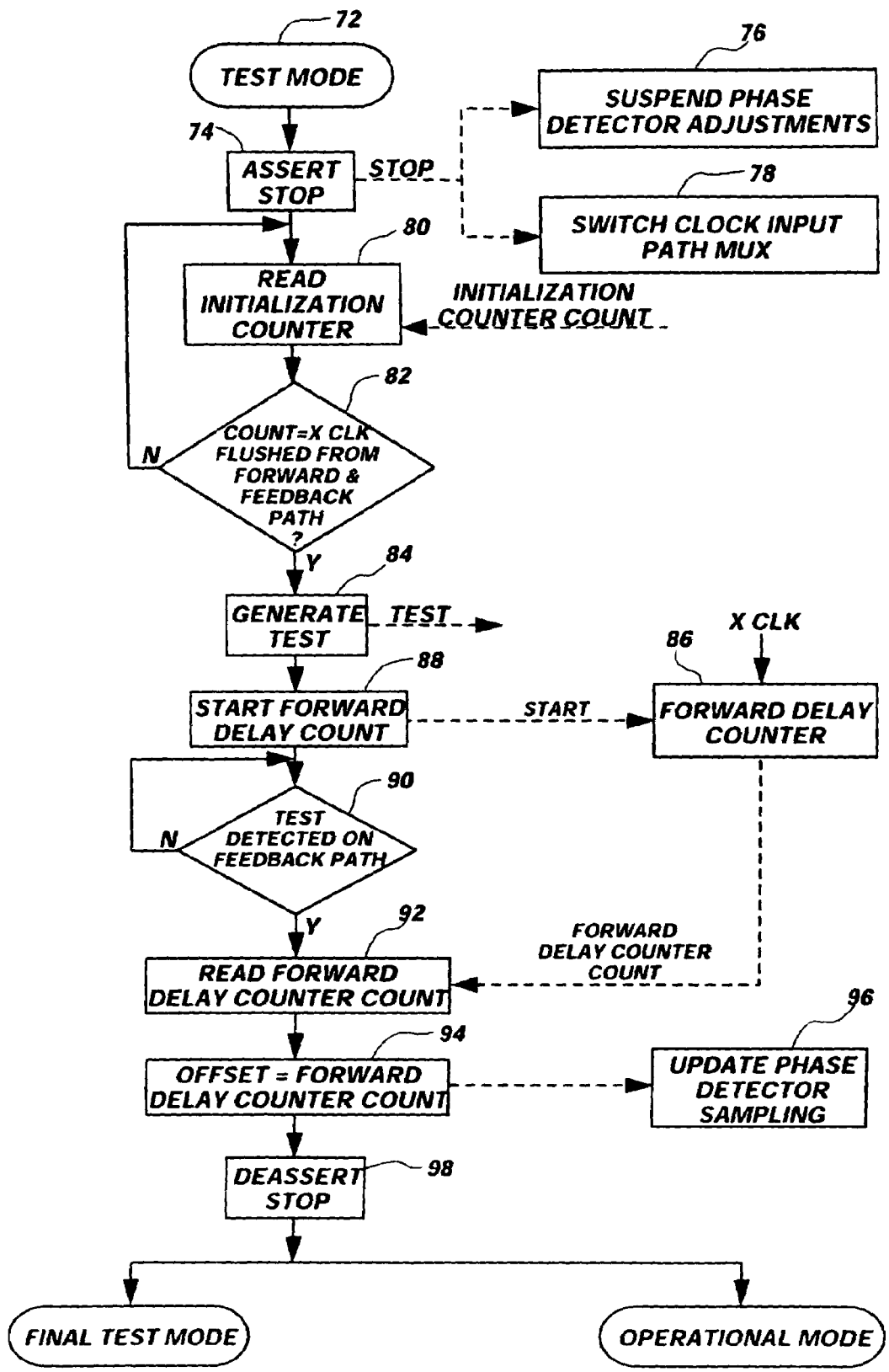
FIGS. 4A and 4B are flowcharts illustrating the identification of the DLL loop delay, in accordance with an embodiment of the present invention.
Figure 4B:
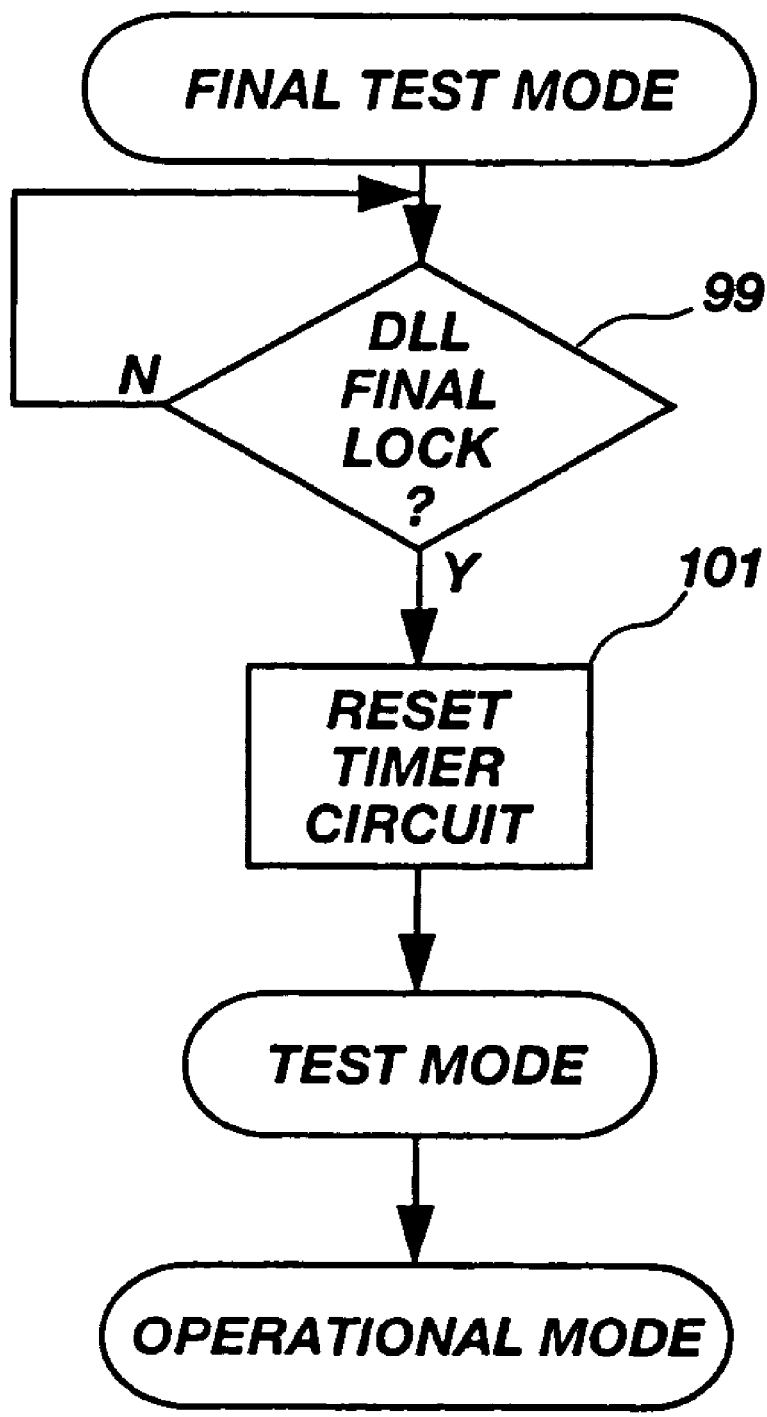

FIGS. 3, 4A and 4B are flowcharts illustrating the functionality of timer circuit 40 in accordance with an exemplary embodiment of the present invention. Upon startup, timer circuit 40 enters into an initialization mode 60 followed by a subsequent test mode 72, described in detail in FIGS. 4A and 4B. During initialization mode 60, memory device 18 may be held in a reset state by a provided RESET signal. When the reset signal is deasserted 62, an initialization counter 66 within timer circuit 40 (FIG. 2) begins counting 64. Initialization counter 66 is driven by the external clock signal XCLK, which increments initialization counter 66. Logic within timer circuit 40 (FIG. 2) reads or evaluates 68 the initialization counter count and compares or determines 70 if the initialization counter count is equivalent to a predetermined phase detector initialization delay of sufficient duration to allow phase detector 46 to obtain a lock state or to obtain at least an adequate or near-lock state. As described above, phase detector 46 (FIG. 2) generates a signal DELAY CONTROL which adjusts the delay through delay line 42 (FIG. 2). During the present initialization mode, one alternative for generating an initial lock or an initial estimate for delay line 42 utilizes an SMD delay line allowing phase detector 46 by way of the forward delay path and the feedback delay path to assume an initial state.

Following initialization mode 60, timer circuit 40 (FIG. 2) transitions into a test mode 72, which generally measures the traversal time of a TEST signal through both the forward delay path and the feedback delay path as measured against the current external XCLK and under current environmental factors. Specifically, timer circuit 40 (FIG. 2) asserts 74 a signal STOP which suspends 76 the phase detector 46 (FIG. 2) from making further adjustments to delay line 42 (FIG. 2). Additionally, the assertion of the signal STOP switches 78 the clock input path 34 (FIG. 2) from the external clock signal XCLK to a test signal TEST initiated by timer circuit 40 (FIG. 2). As described above, multiplexer 38 (FIG. 2) switches the respective input signals to the output signal as directed by the signal STOP.

The initialization counter 66 is compared or read 80 to determine 82 if an adequate amount of time has lapsed to allow all external clock signals XCLK to be flushed from the forward and feedback paths. Following the flushing of the external clock signal XCLK, a TEST signal is generated 84 which may assume the form of a single pulse or an identified pulse pattern capable of being detected by timer circuit 40 (FIG. 2). Additionally, a forward delay counter 86 is started 88 to monitor the number of external clock signals XCLK that occur during the propagation of the signal TEST through both the forward and feedback paths. When timer circuit 40 (FIG. 2) detects 90 the signal TEST as the signal FEEDBACK, the forward delay counter count is retained or read 92 and is assigned 94 as the OFFSET for updating 96 the phase detector sampling and refresh rates within phase detector 46. The signal STOP is deasserted 98 and the test mode terminates with the clock input path 34 (FIG. 2) reverting back to receiving the external clock signal XCLK. In addition, phase detector 46 (FIG. 2) resumes comparing the phase difference between the DLLREF and FEEDBACK signals. In response to the phase differential, and in accordance with the newly derived offset delay path parameters, phase detector 46 resumes continuous fine tuning of an operational delay path within delay line 42. Optionally, following the deassertion 98 of the STOP signal, a final test mode of FIG. 4B determines 99 if a final lock is performed on the DLL. When the final lock is completed, then the timer circuit 40 (FIG. 2) is RESET 101 and the test mode is repeated, which results in the DLL entering the operational mode.

Figure 5:
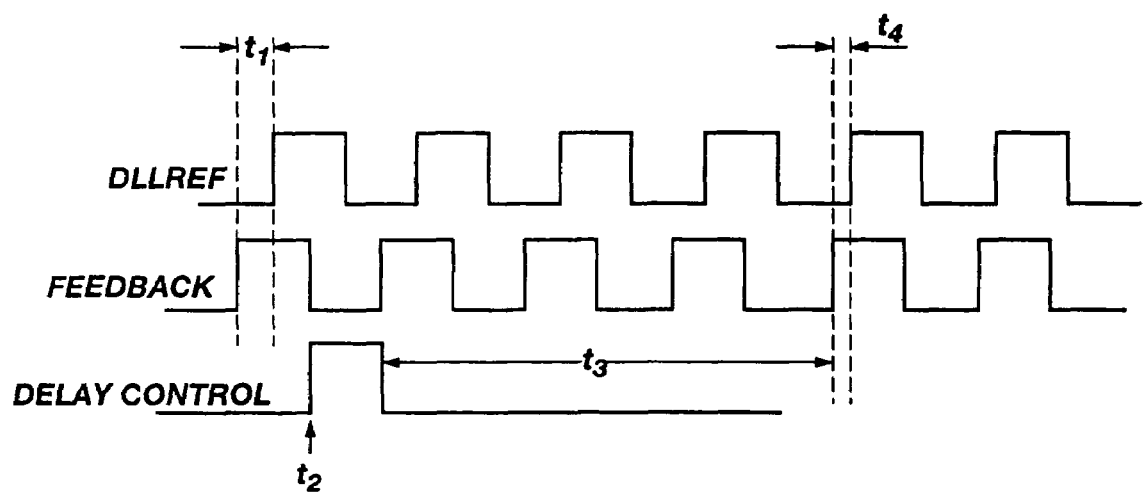
FIG. 5 is a timing diagram illustrating signal relationships of the DLL of FIG. 2.

FIG. 5 is a timing diagram with waveforms of the inputs and output of the phase detector 46 (FIG. 2). The timing diagram illustrates the clock input signal DLLREF lagging the output clock signal FEEDBACK. In this case, in order for both signals to be synchronized, the amount of delay applied to the input signal DLLREF must be increased. Since an embodiment of the present invention finds application to high clock rate devices, multiple clock cycles may occur during the propagation of a clock cycle around the forward loop path (i.e., clock input path 34, delay line 42, and clock distribution network 44) as well as the feedback path through the I/O model 48, all of FIG. 2. The process described with reference to FIGS. 3, 4A and 4B details an approach for accurately determining the number of clock cycles of delay around the DLL loop (i.e., forward loop path and feedback path).

During a time $t_1$, the phase detector 46 determines the error between the input signals and generates an output signal DELAY CONTROL at time $t_4$ directing the shift register 50 to shift the point of entry to the left to increase the delay amount. In accordance with an embodiment of the present invention, the phase detector 46 then awaits the DLL loop delay period $t_3$ which was derived above as the signal OFFSET. During a time $t_4$, the phase detector 46 performs a subsequent comparison to continue to maintain or obtain lock between the input and output clocks. It should be appreciated that the locking approach described herein improves the lock time, in part, by identifying the number of clock cycles required for any modification to the input clock to propagate through the entire DLL delay loop and be observed at the inputs of the phase detector. By allowing delay adjustments as soon as the results are observed allows subsequent changes to the delay line to be made as soon as possible. Such an optimized update approach provides for improvement to the locking time over static approaches. Additionally, by allowing delay line changes only after the propagation of a previous change through the entire DLL delay loop, stability is improved by preventing ringing and overshoot as well as by providing noise immunity to transient variations in voltage.

Generally, the DLL loop delay includes a clock input buffer, DLL forward delay through the delay line, clock distribution network, and I/O model in the feedback path. The delay may vary in clock cycles, depending on the process, voltage, temperature, and frequency. The phase detector may make a wrong decision if the adjustment isn't fed back, resulting in an unstable loop response. The time, normally measured in clock cycles, the phase detector has to wait determines the loop stability and lock time. For a given process and operating frequency, the DLL loop delay can be determined during the initialization and doesn't change dramatically over voltage and temperature variations. Therefore, measuring the loop delay to set up the cut-off frequency of the phase detector improves the stability and locking time regardless of the clock cycle time.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A signal locking method, comprising:
   modeling an output driver of a device;
   traversing a test signal in place of an external clock signal through a delay line and an I/O model of the output driver;
   adjusting the delay line in response to a delay of the test signal through the delay line and the I/O model; and
   delaying an external clock to the output driver through the delay line as configured by the test signal.

2. The signal locking method of claim 1, wherein traversing a test signal includes temporarily switching the test signal into a forward loop path through the delay line and a feedback loop path through the I/O model.

3. The signal locking method of claim 2, wherein adjusting the delay line further comprises timing the test signal around the forward loop path and the feedback loop path.

4. The signal locking method of claim 3, further comprising:
   initializing a phase detector with an approximate forward loop delay; and
   configuring the phase detector responsive to a delay of the test signal traversing the forward loop path and the feedback loop path.

5. The signal locking method of claim 4, wherein the phase detector is configured to suspend generation of an output signal during calculation of the loop delay by a timer circuit.

6. The signal locking method of claim 3, wherein delaying an external clock further comprises updating a sampling rate of a phase detector based upon the delay of the test clock signal around the forward loop path and the feedback loop path.

7. The signal locking method of claim 2, wherein temporarily switching a test clock signal comprises:
   switching the external clock signal out of the forward loop path;
   delaying while the external clock signal completely traverses the forward loop path and the feedback loop path; and
   inputting the test clock signal into the forward loop path.

8. The signal locking method of claim 2, further comprising:
   configuring the delay line to converge on an approximate forward loop delay; and
   updating the approximate forward loop delay in response to a phase difference of the external clock signal and a feedback signal from the feedback loop path.

9. The signal locking method of claim 1, wherein the delay line is a synchronous mirror delay type.

10. The signal locking method of claim 1, wherein the I/O model further comprises a clock input path delay model configured to model delay of a clock input path.

* * * * *

UNITED STATES PATENT AND TRADEMARK OFFICE
CERTIFICATE OF CORRECTION

| | | |
|---|---|---|
| PATENT NO. | : 7,420,361 B2 | Page 1 of 1 |
| APPLICATION NO. | : 11/519556 | |
| DATED | : September 2, 2008 | |
| INVENTOR(S) | : Lin et al. | |

It is certified that error appears in the above-identified patent and that said Letters Patent is hereby corrected as shown below:

In column 7, line 42, in Claim 1, delete "an" and insert -- the --, therefor.

Signed and Sealed this

Fourth Day of November, 2008

JON W. DUDAS
*Director of the United States Patent and Trademark Office*